US010104803B1

(12) United States Patent
Lin et al.

(10) Patent No.: US 10,104,803 B1
(45) Date of Patent: Oct. 16, 2018

(54) CONVEYING APPARATUS WITH LIFT MECHANISM

(71) Applicant: AIC INC., Taoyuan (TW)

(72) Inventors: Ting-Chi Lin, Taoyuan (TW); Fu-An Jhang, Taoyuan (TW); Ta-Chih Chung, Taoyuan (TW); Chung-I Kuo, Taoyuan (TW)

(73) Assignee: AIC INC., Taoyuan (TW)

( * ) Notice: Subject to any disclaimer, the term of this patent is extended or adjusted under 35 U.S.C. 154(b) by 0 days.

(21) Appl. No.: 15/698,628

(22) Filed: Sep. 7, 2017

(51) Int. Cl.

| | |
|---|---|
| ***H05K 7/16*** | (2006.01) |
| ***H05K 7/18*** | (2006.01) |
| ***H05K 5/02*** | (2006.01) |
| ***H05K 7/14*** | (2006.01) |

(52) U.S. Cl.
CPC ............... *H05K 7/16* (2013.01); *H05K 5/023* (2013.01); *H05K 7/1489* (2013.01); *H05K 7/18* (2013.01)

(58) Field of Classification Search
CPC ........ H05K 5/023; H05K 7/16; H05K 7/1489; H05K 7/18
See application file for complete search history.

(56) References Cited

U.S. PATENT DOCUMENTS 7,643,280 B2 * 1/2010 Chen .................... G11B 33/123 361/679.33
9,699,931 B1 * 7/2017 Chen .................... H05K 7/1489
9,717,158 B2 * 7/2017 Della Fiora .......... H05K 7/1487
9,854,698 B2 * 12/2017 Della Fiora .......... H05K 7/1489
2015/0108883 A1 * 4/2015 Chen ........................ H05K 7/16 312/223.2
2015/0342080 A1 * 11/2015 Chen .................. H05K 7/20736 361/679.31
2015/0366095 A1 * 12/2015 Junkins ................ H05K 5/0256 361/679.31
2016/0073554 A1 * 3/2016 Marcade ................ H05K 5/023 211/26
2016/0138755 A1 * 5/2016 Braucht ............... F16M 13/022 361/724
2016/0212877 A1 * 7/2016 Chung ................. H05K 7/1487
2017/0086326 A1 * 3/2017 Peng ......................... H05K 7/16
2017/0347481 A1 * 11/2017 Kuan ................... H05K 7/1489
2018/0157295 A1 * 6/2018 Zhu ......................... G06F 1/187

* cited by examiner

*Primary Examiner* — Hanh V Tran
(74) *Attorney, Agent, or Firm* — Chun-Ming Shih; HDLS IPR Services

(57) ABSTRACT

A conveying apparatus with a lift mechanism includes a carrier, a holder, and a lift handle. The holder is pivoted to the carrier and swings between an operating angle and a maintenance angle. A first arm of the lift handle has an acting end, a resistance end, and a second pivot disposed between the acting end and the resistance end and pivoted to the holder. The first arm further has a protruding length protruding from the bottom side of the holder. When the first arm rotates around the second pivot, the resistance end protrudes the protruding length from the bottom side to rest against the carrier and the holder is lifted to the maintenance angle using the protruding length. Therefore, the storage devices in the holder, originally difficult to be maintained, can be lifted and maintained simply and quickly.

12 Claims, 8 Drawing Sheets

4
41
42
25
241
24
12
421
100
20
2
23
700

CONVEYING APPARATUS WITH LIFT MECHANISM

BACKGROUND OF THE INVENTION

Field of the Invention

The present invention relates to a conveying apparatus used to convey various storage devices storing data and in particular to a conveying apparatus with a lift mechanism.

Description of Prior Art

A conveying apparatus, used for a server or other machines alike, is mainly used to convey various storage devices which store data.

The existing conveying apparatus has a front-row zone located in the front row and at least one rear-row zone located behind the front-row zone. There is a front-row holder installed in the front-row zone and a rear-row holder installed in the rear-row zone. Besides, the openings used for receiving and withdrawing the storage devices are disposed on the fronts of the front-row holder and the rear-row holder. The front-row and the rear-row holders are next to each other, from the front to the rear, which causes the front of the rear-row holder to be obstructed by the rear of the front-row holder. Thus, in this situation, the receiving or the withdrawing regarding the rear-row holders is impossible. Namely, the user can only perform the maintenance for the storage devices in the front-row holder, but not for those in the rear-row holders. Therefore, the front-row-holder has to be removed awkwardly first and the storage devices in the rear-row holder then can be maintained, which is obviously troublesome an inconvenient.

In view of this, the inventor pays special attention to research with the application of related theory and tries to improve and overcome the above disadvantages regarding the prior art, which becomes the improvement target of the inventor.

SUMMARY OF THE INVENTION

The object of the present invention is to provide a conveying apparatus with a lift mechanism, which allows the holder installed in the rear-row zone to be lifted to a maintenance angle for maintenance to avoid interfering with the holder in the front-row zone.

To achieve the above objective, the present invention provides a conveying apparatus with a lift mechanism, which comprises a carrier, a holder, and a lift handle. The holder has a first side, a bottom side, a first pivot pivoted to the carrier. The holder swings through the first pivot back and forth between an operating angle and a maintenance angle. The lift handle has a first arm having an acting end, a resistance end, and a second pivot which is disposed between the acting end and the resistance end and is pivoted on the first side. The distance from the second pivot to the resistance end is a protruding length longer than that from the second pivot to the bottom side. The first arm rotates through the second pivot. The resistance end of the first arm projects the protruding length from the bottom side to rest against the carrier. The holder is lifted to the maintenance angle using the protruding length.

Compared with the prior art, the present invention has the following effects. The user can only operate and rotate the lift handle to lift the front of the rear-row holder to avoid interfering with the rear of the front-row holder. Thus, the storage devices in the holder, originally difficult to be maintained, can be lifted and maintained simply and quickly.

DETAILED DESCRIPTION OF THE INVENTION

The detailed description and technical details of the present invention will be explained below with reference to accompanying drawings. However, the accompanying figures are only for reference and explanation, but not to limit the scope of the present invention.

Figure 1:
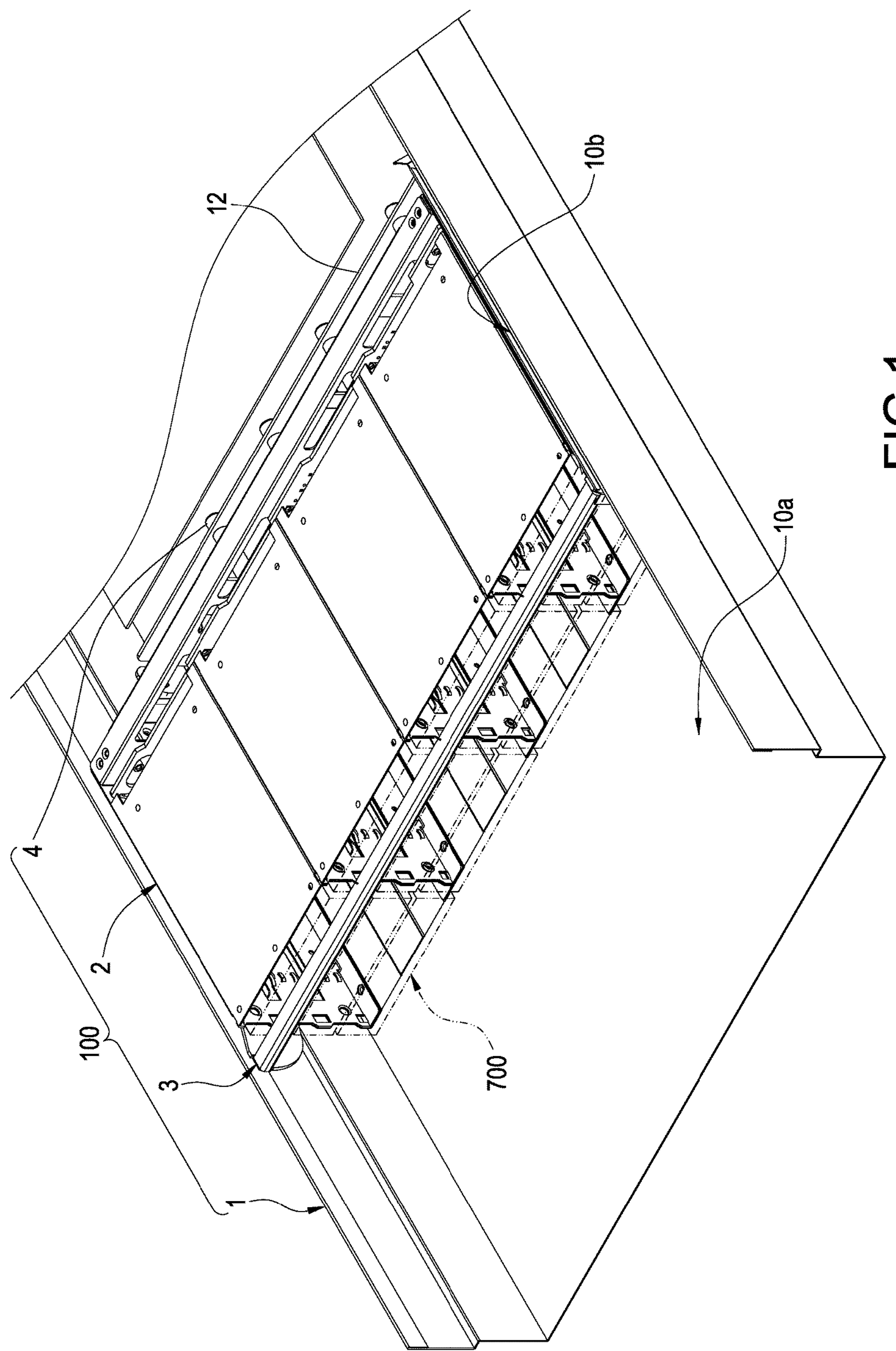
FIG. 1 shows a perspective schematic view of the present invention before being lifted.

The present invention provides a conveying apparatus with a lift mechanism, as shown in FIG. 1. The carrier 1 has a front-row zone 10*a* used to install the front-row holder (not shown) and at least one rear-row zone 10*b* used to install the rear-row holder (i.e., the holder 2). The conveying apparatus 100 of the present invention is mainly to allow the holder 2 installed in the rear-row zone 10*b* to be lifted to the maintenance angle for convenient maintenance when the maintenance is required.

Figure 6:
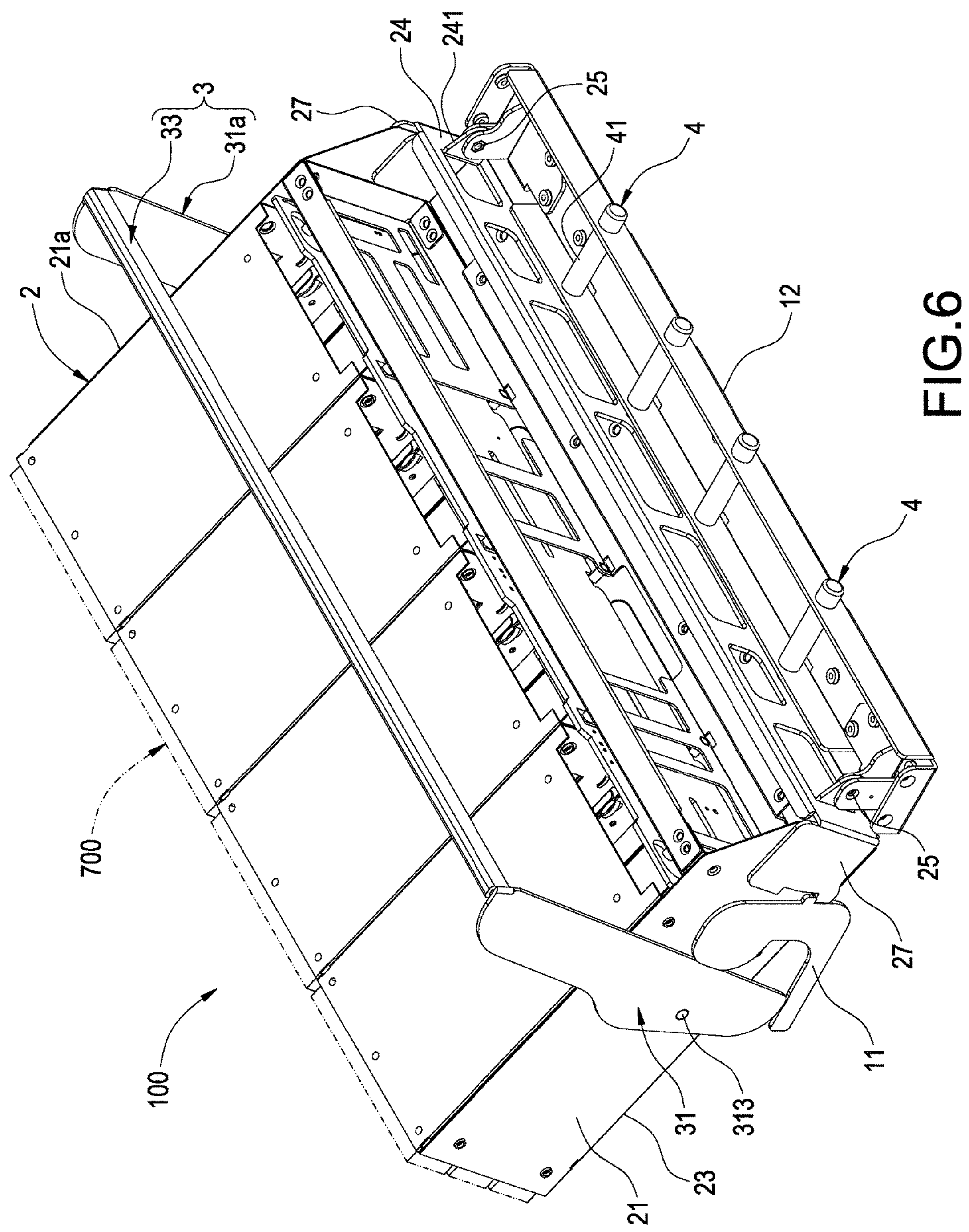
FIG. 6 shows a perspective view of FIG. 3 after being lifted.
Figure 7:
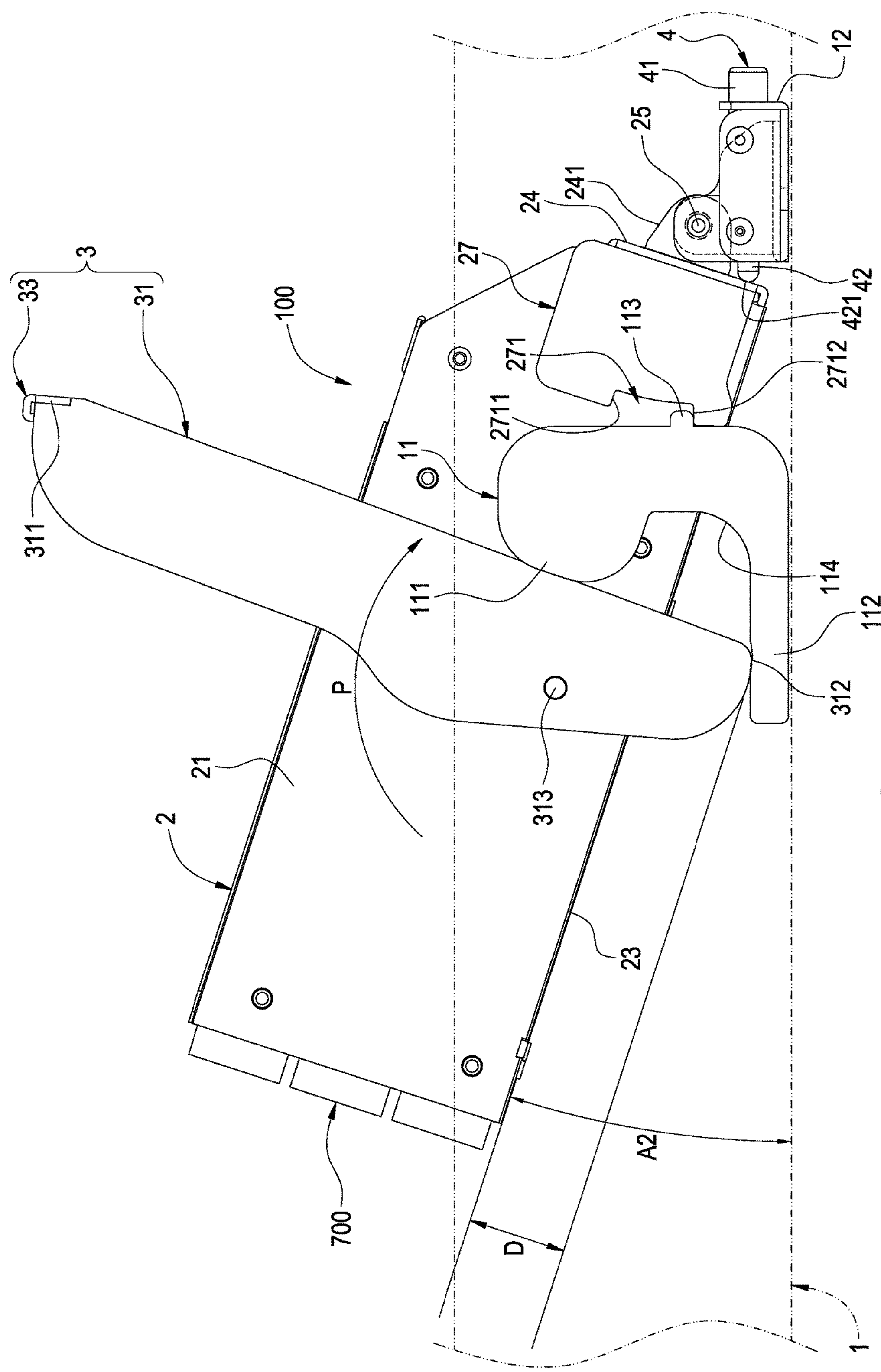
FIG. 7 shows FIG. 4 after being lifted.
Figure 8:
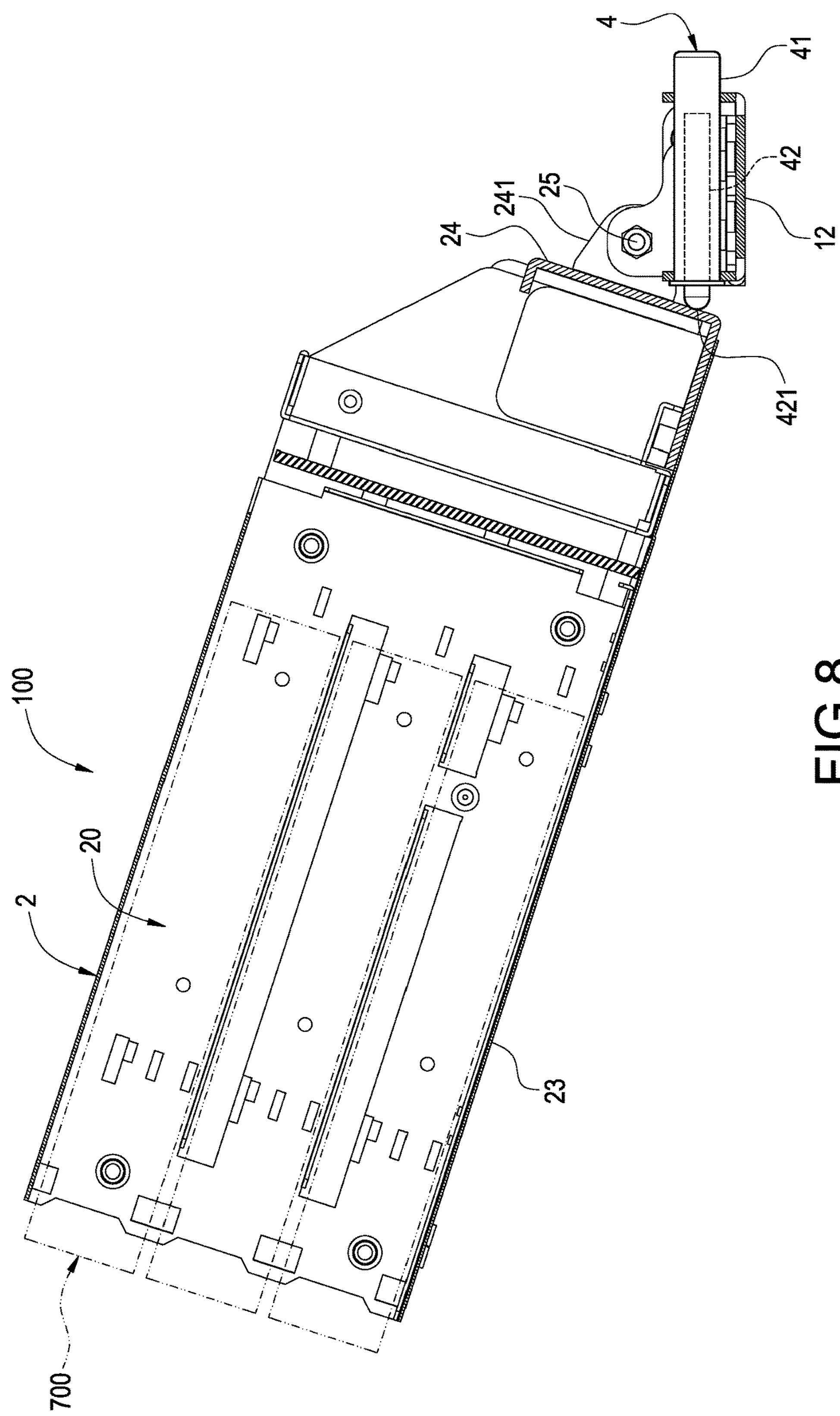
FIG. 8 shows a side cross-sectional view of FIG. 7.

As shown in FIGS. 1-4, the states before being lifted, and FIGS. 6 and 7, the states after being lifted, the conveying apparatus 100 of the present invention comprises a carrier 1, a holder 2, and a lift handle 3. Preferably, the conveying apparatus 100 further comprises at least one buffer 4.

The carrier 1 can be a drawer or something like that, which can be installed in a case (not shown). The type of the carrier 1 is not limited in the present invention and can be acceptable if the carrier 1 can convey the holder 2.

Figure 2:
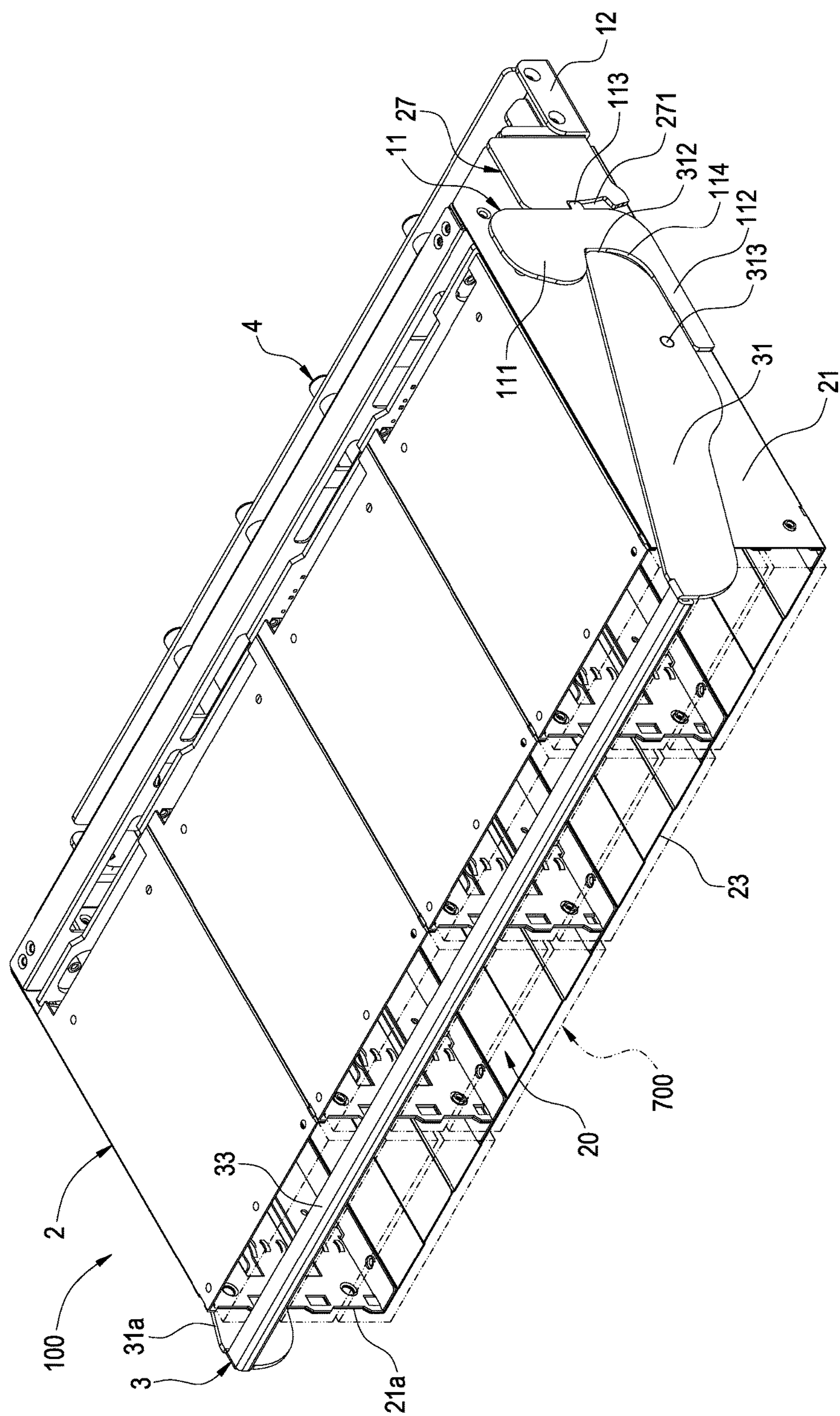
FIG. 2 shows FIG. 1 without the carrier.

The holder 2 can be a frame body to receive a single storage device 700 or to receive plural storage devices 700, which is not limited in the present invention. In the current embodiment, a frame body receiving plural storage devices 700 is used as an example for explanation. Thus, the holder 2 is provided with a plurality of receiving portions 20 arranged side by side, as shown in FIG. 2. Each of the receiving portions 20 can receive a plurality of storage devices 700 stacked vertically.

The holder 2 has a top side (not labeled), a bottom side 23, a first side 21, and a second side 21*a*, which are arranged like a closed loop. The holder 2 further has a front side (not label) and a back side 24 (refer to FIG. 3) opposite to the front side. The first side 21 and the second side 21*a* are briefly called two sides. The front side communicates with an opening of the receiving portion 20 for easily receiving or withdrawing the storage devices 700.

Figure 3:
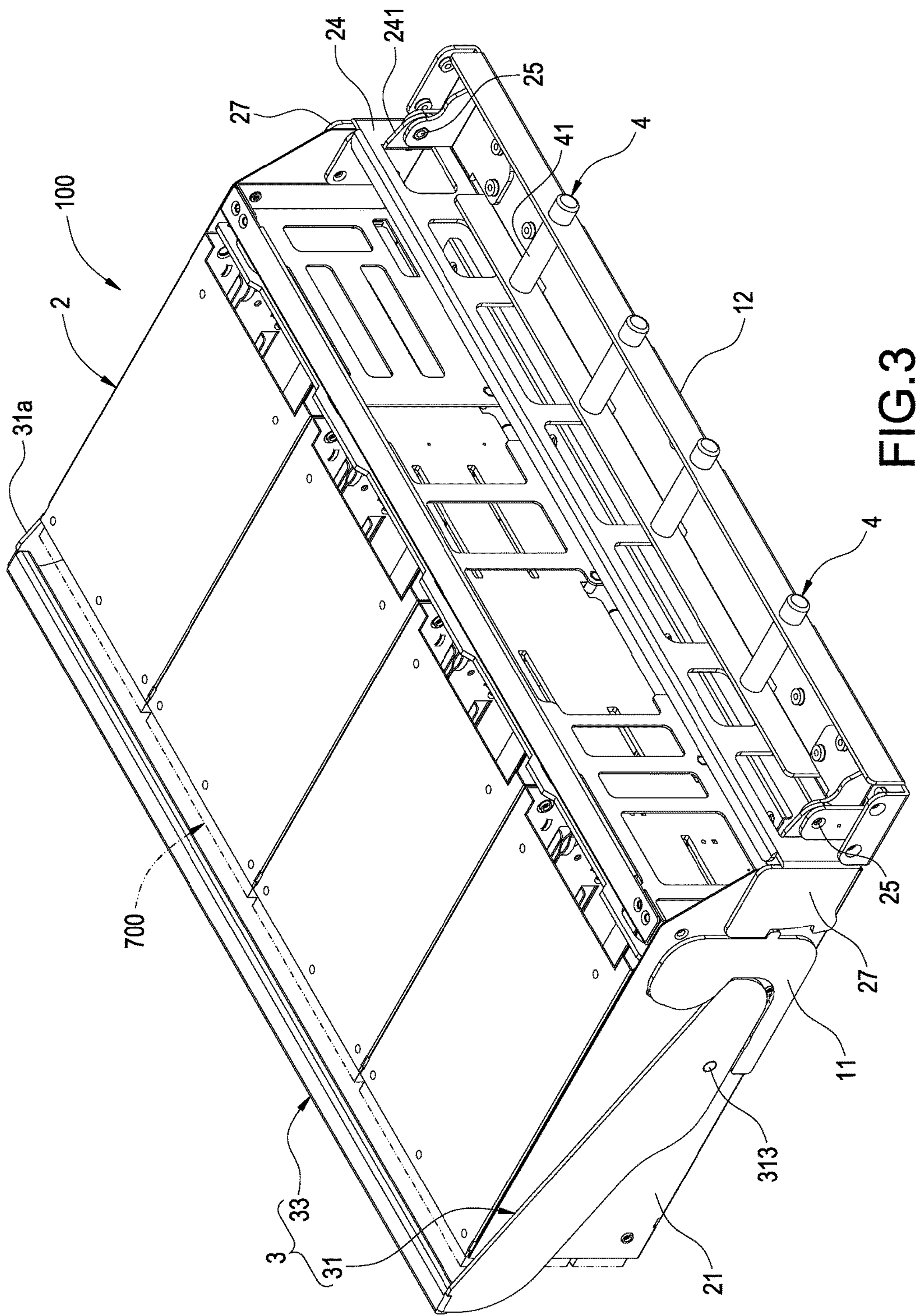
FIG. 3 shows FIG. 2 viewed from another angle.
Figure 4:
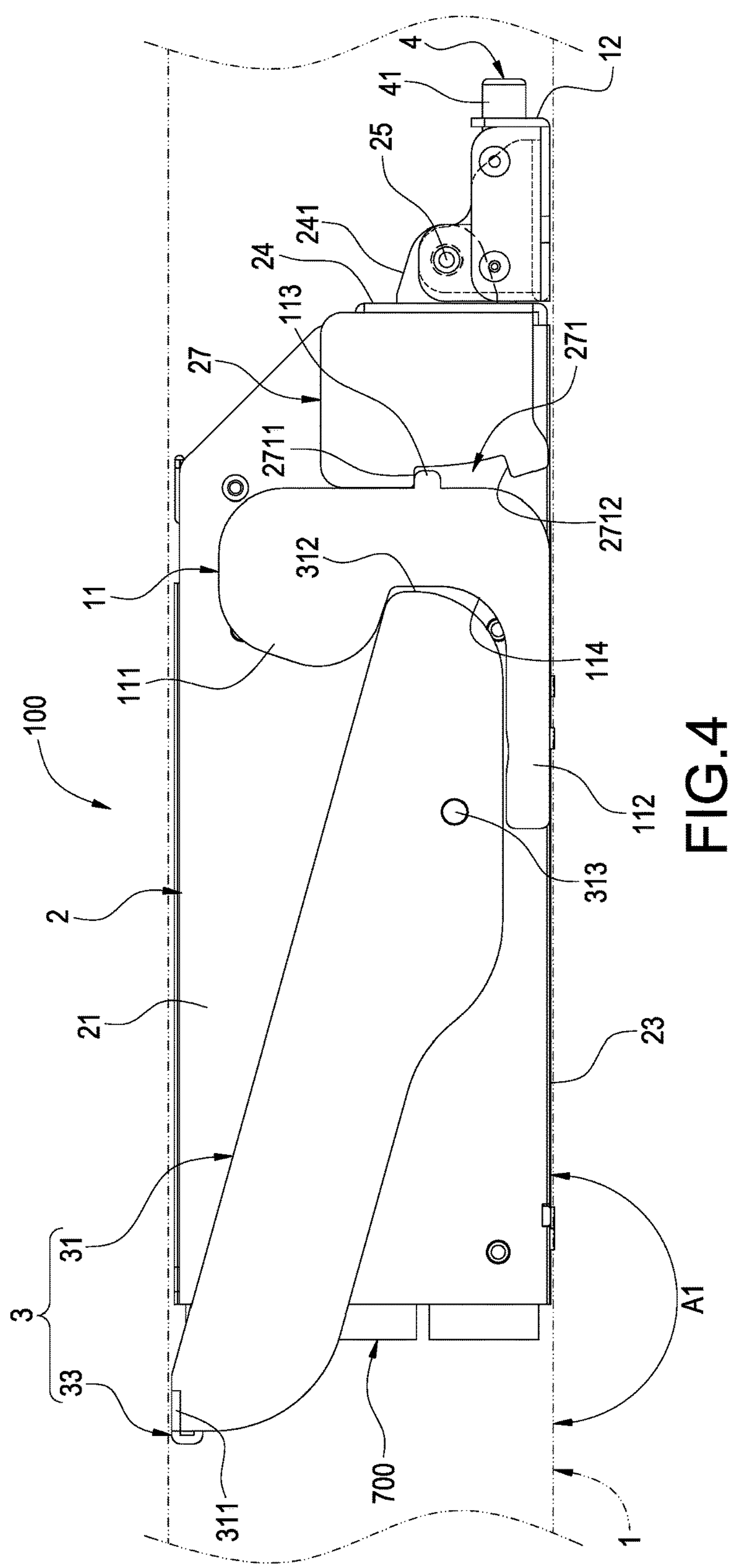
FIG. 4 shows a side view of FIG. 1.
Figure 5:
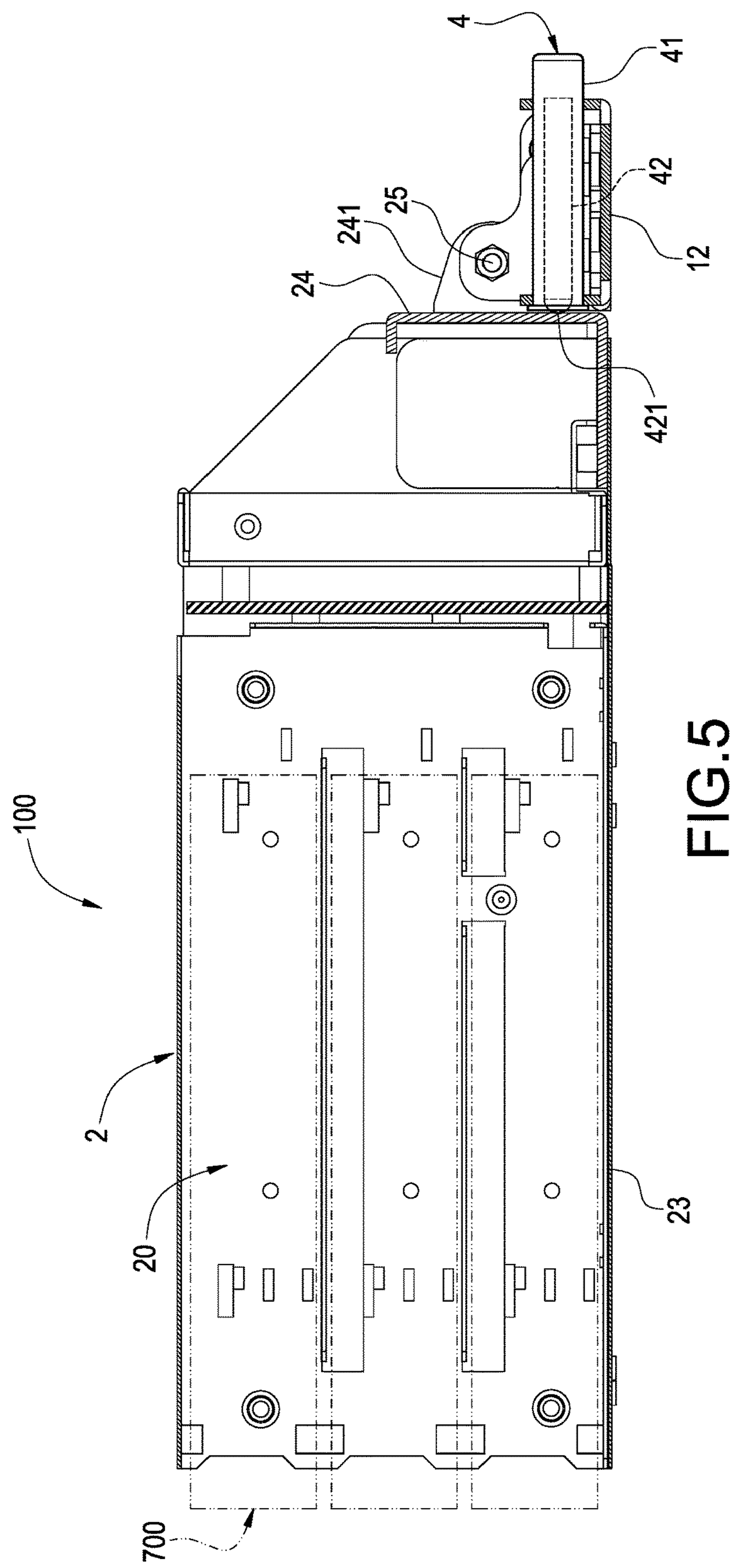
FIG. 5 shows a side cross-sectional view of FIG. 2.

The holder 2 further has a first pivot 25 pivoted to the carrier 1 such that the holder 2 can swing through the first pivot 25 back and forth between the operating angle A1 (refer to FIG. 4) and the maintenance angle A2 (refer to FIG. 7). "Pivoted" means the back side 24 of the holder 2 is directly pivoted (not shown) to the carrier 1. Preferably, as shown in FIGS. 3 and 4, a frame 12 is disposed in the rear-row zone 10*b* of the carrier 1 and at least one bracket

241 is disposed on the back side 24 of the holder 2 and the bracket 241 is pivoted to the frame 12 to form the above-mentioned first pivot 25.

The lift handle 3 comprises a transverse beam 33, a first arm 31, and a second arm 31*a*. The last two parts are briefly called two arms which are identical and symmetrical to each other in structure and are individually connected to two ends of the transverse beam 33. The lift handle 3 can rotate the two arms connected to the two sides of the holder 2 simultaneously to lift the holder 2 or the lift handle 3 can rotate a single first arm 31 connected to the first side 21 of the holder 2 to lift the holder 2. Either of the above two cases can be adopted in the present invention and the former is used as an example for explanation in the present invention. However, the second arm 31*a* and the second side 21*a* are omitted in the following description due to identical structures to the first arm 31 and the first side 21, respectively.

The first arm 31 has an acting end 311, a resistance end 312, and a second pivot 313 which is pivoted on the first side 21 and is disposed between the acting end 311 and the resistance end 312. Also, the distance from the second pivot 313 to the resistance end 312 is a protruding length D (refer to FIG. 7) longer than that from the second pivot 313 to the bottom side 23.

As shown in FIGS. 4 and 7, thus, when the user wants to perform maintenance on the storage devices 700 in the holder 2 installed in the rear-row zone 10*b*, because the front of the holder 2 is blocked by the front-row holder and cannot be maintained directly, at this moment, the user just exerts force on the acting end 311 of the first arm 31 through the transverse beam 33 to rotate the first arm 31 according to the lift rotation path P (refer to FIG. 7) around the second pivot 313 such that the resistance end 312 of the first arm 31 projects the protruding length D from the bottom side 23 to rest against the carrier 1 and then the holder 2 is lifted from the operating angle A1 (refer to FIG. 4) to the maintenance angle A2 (refer to FIG. 7) using the protruding length D. In this way, the front of the holder 2 can avoid interfering with the rear of the front-row holder and can be maintained conveniently.

To limit the lifted angle and the descended angle of the holder 2, at least one first limiter 11 can be disposed in the rear-row zone 10*b* of the carrier 1 and at least one second limiter 27 confined by the first limiter 11 can be disposed in the holder 2. The limiters including the first limiter 11 and the second limiters 27 can be configured as one pair or two pairs in the present invention. Two pairs of the limiters are used as an example for explanation in the present invention. However, one pair of the first limiter 11 and the second limiter 27 will not be mentioned in the following description due to identical structures.

The second limiter 27 can be lifted and descended with the holder 2 while the holder 2 is confined by the first limiter 11 and the second limiter 27 to be lifted up to the maintenance angle A2 or descended down to the operating angle A1.

In particular, a protrusion 113 projects from one side of the first limiter 11 and a restrictive slit 271 is recessed on one side of the second limiter 27 corresponding to the protrusion 13. An upper limit end 2711 and a lower limit end 2712 are disposed in the restrictive slit 271. The protrusion 113 is extended into the restrictive slit 271 correspondingly. When the holder 2 is not lifted (refer to FIG. 4), the second limiter 27 is stopped by the protrusion 113 through the upper limit end 2711 of the restrictive slit 271 such that the holder 2 can only descend to be parallel with the carrier 1. When the holder 2 is lifted (refer to FIG. 7), the second limiter 27 is stopped by the protrusion 113 through the lower limit end 2712 of the restrictive slit 271 such that the holder 2 can only be lifted up to the maintenance angle A2. In this way, the function of confining the holder 2 between the lifted angle and the descended angle is achieved.

Preferably, the first limiter 11 may have a stop portion 111 which is disposed on the above-mentioned lift rotation path P of the first arm 31. When the first arm 31 rotates according to the lift rotation path P, the stop portion 111 can stop the first arm 31 properly to prevent the first arm 31 from over rotation. Also, by means of the stopping by the stop portion 111, the holder 2 can be ensured to be lifted only to the maintenance angle A2. Moreover, the first limiter 11 may further have a resistance portion 112. The resistance end 312 of the first arm 31 can rest against the resistance portion 112 to lift the holder 2. Besides, the first limiter 11 may have a concave portion 114 formed on the other side thereof such that when the first arm 31 is not lifted, the protruding length D of the first arm 31 can be inserted into and received in the concave portion 114.

In other embodiments, not shown in the accompanying figures, the conveying apparatus 100 of the present invention can only have the first limiter 11 without the second limiter 27. The first limiter 11 has the above-mentioned stop portion 111. Preferably, the first limiter 11 further has the above-mentioned resistance portion 112. By means of the stop portion 111, the effect of preventing the first arm 31 from over rotation can be achieved and the lifted angle of the holder 2 can be roughly controlled.

As shown in FIGS. 3, 5, 6 and 8, the buffers 4 are disposed as the supports between the back side 24 of the holder 2 and the carrier 1. In particular, the buffer 4 can be an elastic device (not shown) or can be a hydraulic-type or pneumatic-type buffer as shown in figures. The hydraulic-type or pneumatic-type buffer 4 comprises a main body 41 and a stretchable part 42 which is stretchable with respect to the main body 41. The main body 41 is fixed to the frame 12. The stretchable part 42 has a free end 421 away from the main body 41; the free end 421 presses against the back side 24. Preferably, the level of the back side 24 pressed by the free end 421 is lower than that of the first pivot 25 and the position of the back side 24 pressed by the free end 421 is eccentric to the first pivot 25.

Thus, when the user reverses the first arm 31 to make the resistance end 312 not be pressed, the holder 2 will naturally and reversely descend around the first pivot 25. During the descending, the back side 24 is pressed against by the free ends 421 of the buffers 4 and has the slow descending effect, which prevents the holder 2 from falling heavily to the carrier 1 and further from damaging the storage devices 700.

In summary, compared with the prior art, the present invention has the following effects. Only the lift handle 3 is required to be operated and rotated to lift the front of the holder 2 without interfering with the rear of the front-row holder (not shown). Therefore, only a simple and quick operation can enable the storage devices 700 in the holder 2, originally difficult to be maintained, to be lifted and maintained.

In addition, the present invention has other effects as follows. By means of the first limiter 11 and the second limiter 27, the lifted angle and the descended angle of the holder 2 can be limited. By means of the stop portion 111, the over rotation caused by the first arm 31 during being lifted can be prevented. By means of the buffers 4, a slow descending effect is obtained during the descending of the holder 2, which thus prevents the holder 2 from falling heavily to the carrier 1 and further from damaging the storage devices 700.

The embodiments disclosed above are only preferred embodiments of the present invention, but not to limit the scope of the present invention. The scope of the present invention should be embraced by the accompanying claims and includes all the equivalent modifications and not be limited to the previous description.

What is claimed is:

1. A conveying apparatus with a lift mechanism, comprising:

a carrier;

a holder having a first side, a bottom side, a first pivot pivoted to the carrier, wherein the holder swings through the first pivot back and forth between an operating angle and a maintenance angle; and a lift handle having a first arm having an acting end, a resistance end, and a second pivot which is disposed between the acting end and the resistance end and is pivoted on the first side, wherein the distance from the second pivot to the resistance end is a protruding length longer than that from the second pivot to the bottom side, wherein the first arm rotates through the second pivot, wherein the resistance end of the first arm projects the protruding length from the bottom side to rest against the carrier, wherein the holder is lifted to the maintenance angle using the protruding length;

wherein the carrier is provided with a first limiter, wherein the holder is provided with a second limiter confined by the first limiter, wherein the second limiter is lifted with the holder, wherein the holder is confined by the first limiter and the second limiter to be lifted up to the maintenance angle;

wherein the first limiter is provided with a protrusion and the second limiter is provided with a restrictive slit, wherein the protrusion is extended into the restrictive slit correspondingly, wherein an upper limit end and a lower limit end are disposed in the restrictive slit and are selectively to stop the protrusion.

2. The conveying apparatus with a lift mechanism according to claim 1, wherein the first limiter has a stop portion, wherein the first arm rotates according to a lift rotation path to lift the holder and the stop portion is on the lift rotation path, wherein the stop portion stops the rotation angle of the first arm according to the lift rotation path.

3. The conveying apparatus with a lift mechanism according to claim 2, wherein the first limiter further has a resistance portion, wherein the resistance end of the first arm rests against the resistance portion to lift the holder.

4. The conveying apparatus with a lift mechanism according to claim 1, further comprising at least one buffer, wherein the holder further comprises a back side pivoted to the carrier to form the first pivot, wherein the at least one buffer is disposed as a support between the back side and the carrier.

5. The conveying apparatus with a lift mechanism according to claim 4, wherein the carrier is provided with a frame, wherein a bracket is disposed on the back side, wherein the bracket is pivoted to the frame to form the first pivot.

6. The conveying apparatus with a lift mechanism according to claim 4, wherein the buffer is an elastic device.

7. The conveying apparatus with a lift mechanism according to claim 1, the lift handle further comprises a transverse beam and a second arm identical to the first arm, wherein the holder further has a second side opposite to the first side, wherein the first arm and the second arm are individually connected to two ends of the transverse beam, wherein the first arm and the second arm are pivoted to the first side and the second side, respectively, through the individual second pivots, wherein the lift handle rotates through the individual second pivots.

8. The conveying apparatus with a lift mechanism according to claim 1, wherein the holder is provided with a plurality of receiving portions.

9. The conveying apparatus with a lift mechanism according to claim 1, wherein the first limiter is provided with a stop portion, wherein the first arm rotates according to a lift rotation path to lift the holder and the stop portion is on the lift rotation path, wherein the stop portion stops the rotation angle of the first arm according to the lift rotation path.

10. The conveying apparatus with a lift mechanism according to claim 9, wherein the first limiter further has a resistance portion, wherein the resistance end of the first arm rests against the resistance portion to lift the holder.

11. A conveying apparatus with a lift mechanism, comprising:

a carrier;

a holder having a first side, a bottom side, a first pivot pivoted to the carrier, wherein the holder swings through the first pivot back and forth between an operating angle and a maintenance angle;

a lift handle having a first arm having an acting end, a resistance end, and a second pivot which is disposed between the acting end and the resistance end and is pivoted on the first side, wherein the distance from the second pivot to the resistance end is a protruding length longer than that from the second pivot to the bottom side; and at least one buffer, wherein the holder further comprises a back side pivoted to the carrier to form the first pivot, wherein the at least one buffer is disposed as a support between the back side and the carrier, wherein the first arm rotates through the second pivot, wherein the resistance end of the first arm projects the protruding length from the bottom side to rest against the carrier, wherein the holder is lifted to the maintenance angle using the protruding length;

wherein the carrier is provided with a frame, wherein a bracket is disposed on the back side, wherein the bracket is pivoted to the frame to form the first pivot;

wherein the buffer comprises a main body and a stretchable part which is stretchable with respect to the main body, wherein the main body is fixed to the frame, wherein the stretchable part has a free end away from the main body, wherein the free end presses against the back side.

12. The conveying apparatus with a lift mechanism according to claim 11, wherein the level of the back side pressed by the free end is lower than that of the first pivot, wherein the position of the back side pressed by the free end is eccentric to the first pivot.

* * * * *